(12) United States Patent
Hsiao et al.

(10) Patent No.: US 10,840,275 B2
(45) Date of Patent: Nov. 17, 2020

(54) DOUBLE-SIDED ELECTRODE STRUCTURE AND PATTERNING PROCESS THEREOF

(71) Applicant: Cambrios Film Solutions Corporation, Tortola (VG)

(72) Inventors: Chung-Chin Hsiao, Zhubei (TW); Siou-Cheng Lien, Toufen (TW); Chia-Yang Tsai, New Taipei (TW)

(73) Assignee: Cambrios Film Solutions Corporation, Tortola (VG)

( * ) Notice: Subject to any disclaimer, the term of this patent is extended or adjusted under 35 U.S.C. 154(b) by 0 days.

(21) Appl. No.: 16/426,102

(22) Filed: May 30, 2019

(65) Prior Publication Data

US 2019/0371830 A1 Dec. 5, 2019

(30) Foreign Application Priority Data

May 30, 2018 (CN) .......................... 2018 1 0541243

(51) Int. Cl.
| | | |
|---|---|---|
| *G06F 3/041* | (2006.01) | |
| *H01L 27/12* | (2006.01) | |
| *H05K 1/09* | (2006.01) | |
| *H05K 3/06* | (2006.01) | |

(52) U.S. Cl.
CPC ........ *H01L 27/1262* (2013.01); *G06F 3/0412* (2013.01); *H01L 27/124* (2013.01); *H05K 1/09* (2013.01); *H05K 3/06* (2013.01); *G06F 2203/04103* (2013.01); *H05K 2201/0326* (2013.01)

(58) Field of Classification Search
CPC ........ G06F 2203/04103; G06F 3/0443; G06F 2203/04112; G06F 3/0445; G06F 3/03547; G02F 1/13338; H05K 2201/026; H05K 2201/10128; H05K 3/0023; G03F 7/0957; G03F 7/2032; G03F 7/26
USPC .......... 345/173; 438/584, 800; 257/734, 798
See application file for complete search history.

(56) References Cited

U.S. PATENT DOCUMENTS

| | | | | |
|---|---|---|---|---|
| 2016/0246415 | A1* | 8/2016 | Bae .......................... | G06F 3/044 |
| 2016/0306461 | A1* | 10/2016 | Sugitani .................. | G06F 3/047 |
| 2016/0320874 | A1* | 11/2016 | Park ........................ | G06F 3/044 |
| 2017/0277292 | A1* | 9/2017 | Park ..................... | G02F 1/13338 |
| 2020/0159123 | A1* | 5/2020 | Kanna .................... | G03F 7/0047 |

FOREIGN PATENT DOCUMENTS

TW 201237708 A 9/2012

* cited by examiner

*Primary Examiner* — S. V. Clark
(74) *Attorney, Agent, or Firm* — Cooper Legal Group, LLC

(57) ABSTRACT

A patterning process for forming a double-sided electrode structure includes: providing a substrate having two opposite surfaces, wherein a first photo-sensitive layer and a second photo-sensitive layer are respectively formed on the opposite surfaces; forming a first metal nanowire layer on the first photo-sensitive layer and a second metal nanowire layer on the second photo-sensitive layer; and performing a double-sided lithography process. The lithography process includes: performing an exposure process to define a removing area and a remaining area on both of the first and the second photo-sensitive layers; and removing the first and second photo-sensitive layers and the first and second metal nanowire layers in the defined removing areas by a developer solution, thereby patterning the first and second metal nanowire layers.

17 Claims, 11 Drawing Sheets

DOUBLE-SIDED ELECTRODE STRUCTURE AND PATTERNING PROCESS THEREOF

CROSS REFERENCE TO RELATED APPLICATIONS

This Non-provisional application claims priority under 35 U.S.C. § 119(a) to Patent Application No. 201810541243.4 filed in People's Republic of China on May 30, 2018, the entire contents of which are hereby incorporated by reference.

BACKGROUND

Technology Field

The present disclosure relates to a double-sided electrode structure and a patterning process thereof.

Description of Related Art

Transparent conductive material, which has good light transmission and electrical conductivity, is generally applied in various display devices or touch devices. In many applications, the transparent conductive material is a metal oxide, such as indium tin oxide (ITO), indium zinc oxide (IZO), cadmium tin oxide (CTO), or aluminum-doped zinc oxide (AZO). A thin film of the metal oxide is formed by physical vapor deposition (PVD) or chemical vapor deposition (CVD), and then patterned by a laser process to form, for example, a touch sensor. However, this laser patterning method applied to the metal oxide thin film has the problems of high cost, complex manufacturing processes, and low yield. Further, the patterned metal oxide thin film is visible to users of a device incorporating the touch sensor. As such, new kinds of transparent conductive materials are developed, one such example being nanowires-based transparent conductors.

When utilizing nanowires to manufacture touch electrodes, there are many issues to be solved in the manufacturing process and structure of the metal wiring of the nanowires and the peripheral area. For example, in the patterning process of a double-sided structure, photoresist may be coated on the surface of the nanowire layer (e.g., a silver nanowire layer) on top of the substrate. Exposure, developing and etching processes are then performed to define the upper electrode structure. Next, the upper electrode structure must be protected before performing the photoresist coating process, and the exposure, developing and etching processes for the lower nanowire layer to define the lower electrode structure. The upper and lower patterning processes can each be performed by a general lithography process or a laser engraving process. However, the above-mentioned manufacturing method defines the upper electrode structure and the lower electrode structure in different processes, so that manufacturing steps are complex and require more manufacturing time.

When utilizing laser technology to perform the patterning process on the nanowires, excess energy of the laser causes an undesired heating effect, which damages the edge precision of the wires and even the underlying substrate (forming defects) if the operation parameters are not properly controlled. Accordingly, a block layer is provided between the nanowire layer and the substrate. However, the block layer remains on the substrate after finishing the above processes, and the block layer in the final product affects optical properties thereof (e.g. visible light transmission rate or haze), thereby lowering display quality.

In addition, etching solutions used in conventional processes are usually a strong acid solution, which can react with the metal wires and thereby decrease the reliability of the product. Any residual etching solution must further be cleaned by an additional process.

When utilizing the nanowires to manufacture the touch sensing electrodes, an overcoat layer is be formed on the nanowires to protect the nanowires. Any residual overcoat layer, after an etch process, will be disposed between the connecting pads and the external circuit board, which may cause a high resistance therebetween.

Therefore, it is desired to redesign the manufacturing process and electrode structure when utilizing the nanowires to manufacture the touch sensing electrodes, thereby obtaining better product performance.

SUMMARY

Some embodiments of this disclosure provide a patterning method of a double-sided electrode structure, which has an advantage of high manufacturing efficiency.

Some embodiments of this disclosure provide a patterning process for forming a double-sided electrode structure, comprising steps of: providing a substrate, wherein the substrate has two opposite surfaces, and a first photo-sensitive layer and a second photo-sensitive layer are respectively formed on the opposite surfaces; forming a first metal nanowire layer on the first photo-sensitive layer and a second metal nanowire layer on the second photo-sensitive layer, wherein the first metal nanowire layer and the second metal nanowire layer are made of metal nanowires; and performing a double-sided lithography process, comprising: performing an exposure process to define a removing area and a remaining area on the first photo-sensitive layer and a removing area and a remaining area on the second photo-sensitive layer; and removing the first and second photo-sensitive layers and the metal nanowires of the first and second metal nanowire layers in the defined removing areas by a developer solution, thereby patterning the first and second metal nanowire layers to form a first electrode and a second electrode on the opposite surfaces, respectively.

In some embodiments of this disclosure, the step of performing the exposure process comprises: providing a first light source corresponding to the first photo-sensitive layer and a second light source corresponding to the second photo-sensitive layer, wherein lights emitted from the first light source and the second light source have the same wavelength or in an substantially effective wavelength range to the first and second photo-sensitive materials. The first photo-sensitive layer absorbs more than about 80% of a total energy of the light emitted from the first light source, and the second photo-sensitive layer absorbs more than about 80% of a total energy of the light emitted from the second light source.

In some embodiments of this disclosure, the step of performing the exposure process comprises: providing a first light source corresponding to the first photo-sensitive layer and a second light source corresponding to the second photo-sensitive layer, wherein lights emitted from the first light source and the second light source have the same wavelength; wherein the first and second photo-sensitive layers are added with about 0.1%~10% of a light absorption additive by weight.

In some embodiments of this disclosure, a concentration of the light absorption additive is about 1%~3% by weight, a light transmittance of the first photo-sensitive layer with respect to the light emitted from the first light source is less than about 30%, and a light transmittance of the second photo-sensitive layer with respect to the light emitted from the second light source is less than about 30%.

In some embodiments of this disclosure, the step of performing the exposure process comprises: providing a first light source corresponding to the first photo-sensitive layer and a second light source corresponding to the second photo-sensitive layer, wherein lights emitted from the first light source and the second light source have different wavelengths. The light emitted from the first light source in a wavelength range which is ineffective to the second photo-sensitive material, and the light emitted from the second light source in a wavelength range which is ineffective to the first photo-sensitive material.

In some embodiments of this disclosure, the first and second photo-sensitive layers are made of photoresists with the same photo sensitivity or with different photo sensitivities.

In some embodiments of this disclosure, the patterning method further comprises: forming a protective layer; and forming a peripheral circuit, wherein the peripheral circuit is electrically connected with the first electrode and the second electrode.

Some embodiments of this disclosure also provide a double-sided electrode structure, comprising: a substrate having two opposite surfaces, wherein a first photo-sensitive layer and a second photo-sensitive layer are respectively formed on the opposite surfaces; and the first photo-sensitive layer and a first metal nanowire layer stacked on the first surface, and the second photo-sensitive layer and a second metal nanowire layer stacked on the second surface. A removing area and a remaining area are defined on the first photo-sensitive layer and a removing area and a remaining area are defined on the second photo-sensitive layer by an exposure process, the first photo-sensitive layer and the first metal nanowire layer in the removing area are removed to define a first electrode on the first surface, and the second photo-sensitive layer and the second metal nanowire layer in the removing area are removed to define a second electrode on the second surface.

In some embodiments of this disclosure, the first and second photo-sensitive layers are made of photoresists with the same wavelength absorption property, the first photo-sensitive layer absorbs more than about 80% of a total energy of a light emitted from a first light source, and the second photo-sensitive layer absorbs more than about 80% of a total energy of a light emitted from a second light source.

In some embodiments of this disclosure, the first and second photo-sensitive layers are made of photoresists with the same wavelength absorption property, and the first and second photo-sensitive layers are added with about 0.1%~10% of a light absorption additive.

In some embodiments of this disclosure, a concentration of the light absorption additive is about 1%~3%, a light transmittance of the first photo-sensitive layer with respect to the light emitted from the first light source is less than about 30%, and a light transmission rate of the second photo-sensitive layer with respect to the light emitted from the second light source is less than about 30%.

In some embodiments of this disclosure, the first and second photo-sensitive layers are made of photoresists with different wavelength absorption properties.

In some embodiments of this disclosure, parts of the first photo-sensitive layer and the first metal nanowire layer in the remaining area of the first photo-sensitive layer have the same pattern, and parts of the second photo-sensitive layer and the second metal nanowire layer in the remaining area of the second photo-sensitive layer have the same pattern.

In some embodiments of this disclosure, the first electrode comprises a plurality of sensing electrodes extending along a first direction, and the second electrode comprises a plurality of sensing electrodes extending along a second direction. The sensing electrodes are located in a display area of the substrate.

In some embodiments of this disclosure, the double-sided electrode structure further comprises a peripheral circuit disposed in a peripheral area of the substrate, and the peripheral circuit electrically connected with the sensing electrodes.

In some embodiments of this disclosure, the double-sided electrode structure further comprises a protective layer covering the first electrode and the second electrode.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1:
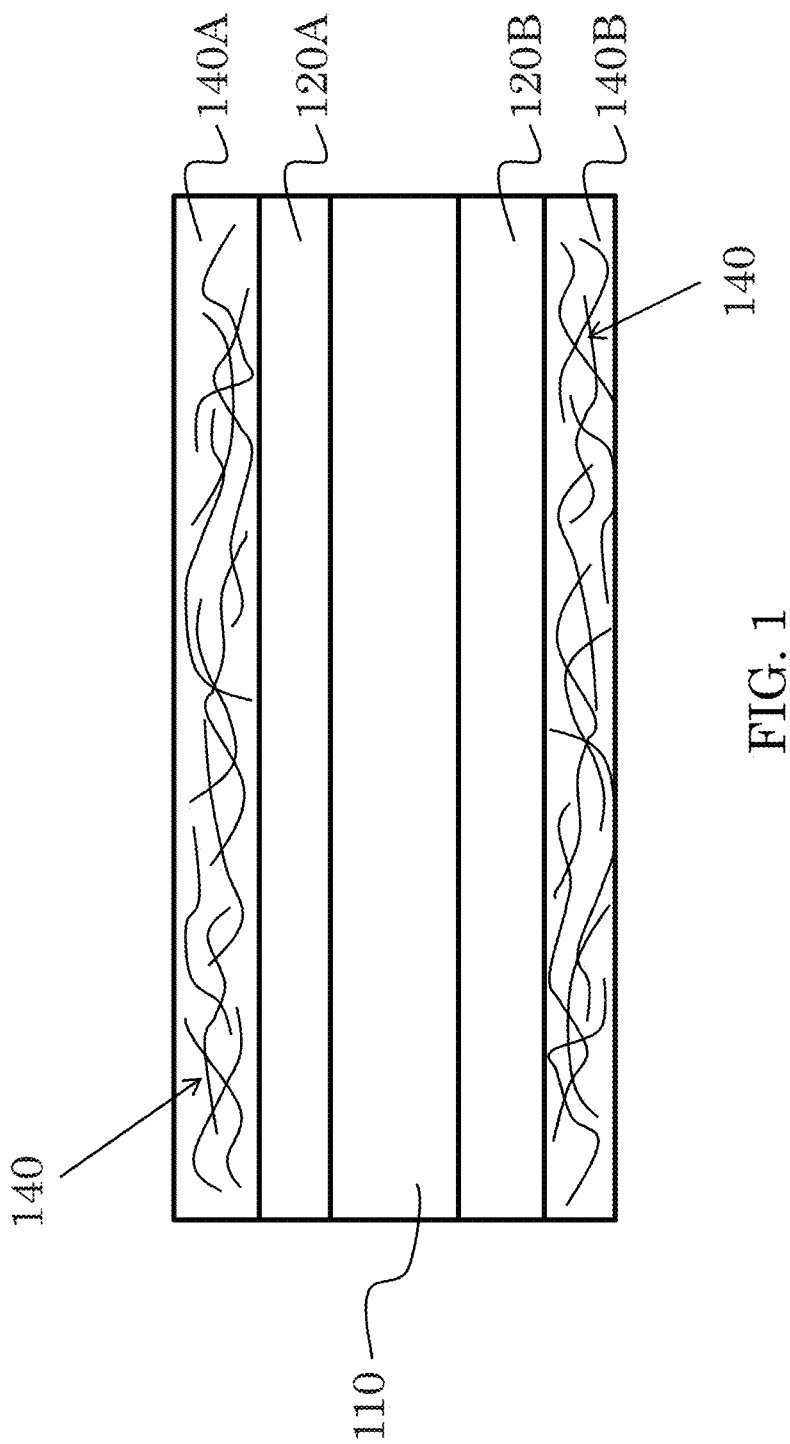
FIG. 1 is a schematic diagram showing the first step of the manufacturing method of the double-sided electrode structure according to some embodiments of this disclosure.

The various embodiments of the present disclosure are illustrated in the drawings, and the practical details will be described in the following embodiments. However, it should be understood that these practical details are not intended to limit the disclosure. That is, in some embodiments of the disclosure, these practical details are not necessary. In addition, some of the conventional structures and elements are shown in the drawings in a simplified manner.

As used herein, "about" or "rough" is generally an error or a range within 20% of a value, preferably a range within 10%, and more preferably a range within 5%. Unless otherwise stated, the numerical values mentioned in this disclosure are considered as approximations, that is, they have an error or a range as indicated by "about" or "rough".

Figure 2:
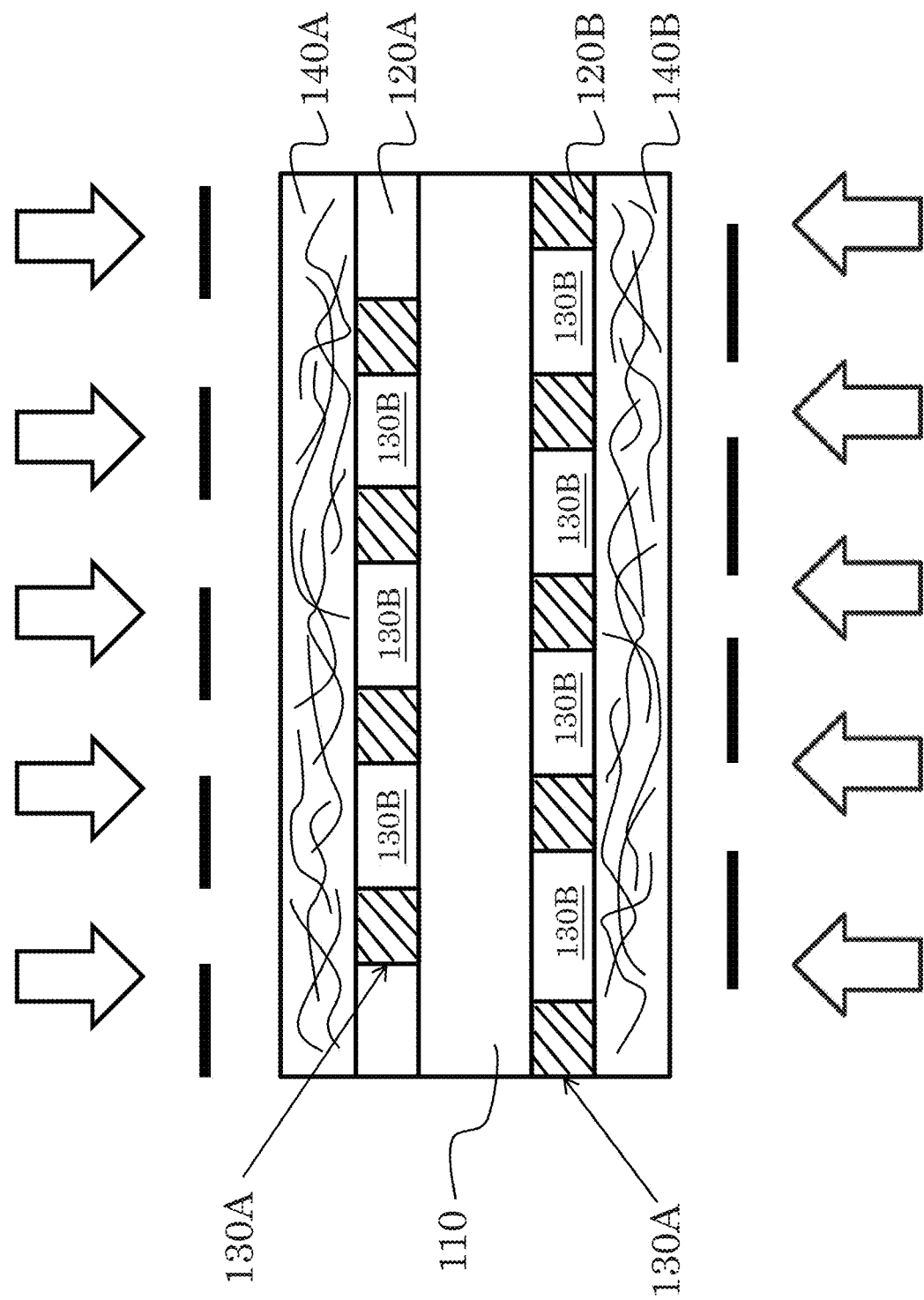
FIG. 2 is a schematic diagram showing the second step of the manufacturing method of the double-sided electrode structure according to some embodiments of this disclosure.
Figure 3:
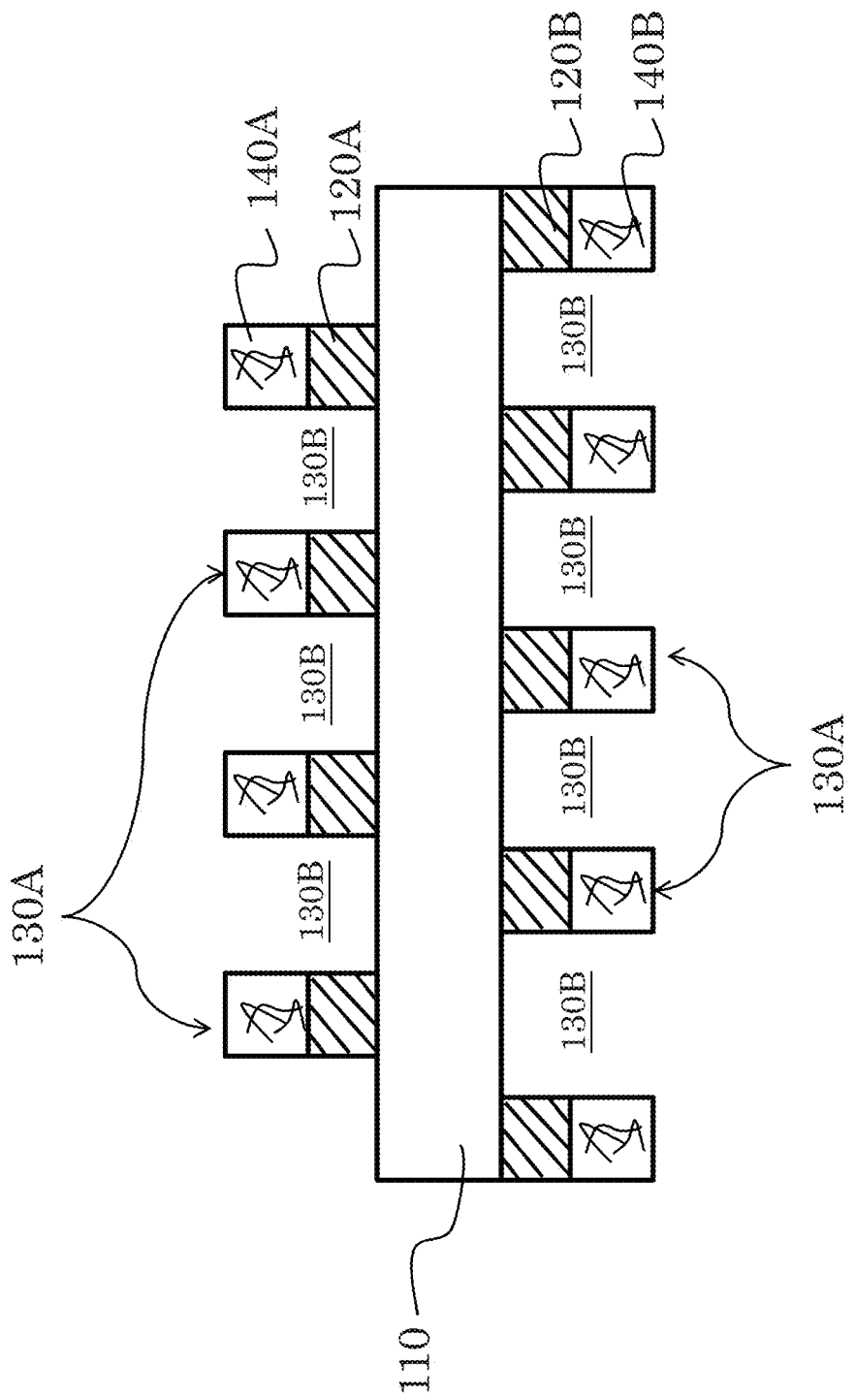
FIG. 3 is a schematic diagram showing the third step of the manufacturing method of the double-sided electrode structure according to some embodiments of this disclosure.

FIGS. 1 to 3 are schematic diagrams showing the steps of the manufacturing method of a double-sided electrode structure according to some embodiments of this disclosure. The process details of this embodiment will be described hereinafter. As shown in FIG. 1, a substrate 110 is provided. In some embodiments of this disclosure, the substrate 110 is ideally a transparent substrate. Specifically, the substrate 110 can be a rigid transparent substrate or a flexible transparent substrate, and the material of the transparent materials includes but not limited to glass, polymethylmethacrylate (PMMA), polyvinyl chloride (PVC), polypropylene (PP), polyethylene terephthalate (PET), polyethylene naphthalate (PEN), polycarbonate (PC), and polystyrene (PS).

Next, also referring to FIG. 1, the photo-sensitive layers are formed on the first surface (e.g. the upper surface) and the second surface (e.g. the lower surface) of the substrate 110. As shown in FIG. 1, the upper surface of the substrate 110 is formed with a first photo-sensitive layer 120A, and the lower surface of the substrate 110 is formed with a second photo-sensitive layer 120B. In an embodiment, the first photo-sensitive layer 120A and the second photo-sensitive layer 120B are made of a material having the same photo-sensitive property. For example, the first photo-sensitive layer 120A and the second photo-sensitive layer 120B can both be made of the positive photoresist or the negative photoresist, and this disclosure is not limited thereto.

Referring to FIG. 1 again, a metal nanowire layer is formed on each photo-sensitive layer. As shown in FIG. 1, the first metal nanowire layer 140A is formed on the first photo-sensitive layer 120A, and the second metal nanowire layer 140B is formed on the second photo-sensitive layer 120B. In other words, the first photo-sensitive layer 120A and the first metal nanowire layer 140A are stacked on the upper surface of the substrate 110 in sequence, and the second photo-sensitive layer 120B and the second metal nanowire layer 140B are stacked on the lower surface of the substrate 110 in sequence. In one embodiment, the metal nanowire layer (i.e., the first metal nanowire layer 140A and the second metal nanowire layer 140B) at least contains metal nanowires 140. In this embodiment, an ink/solution containing the metal nanowires 140 is coated on the photo-sensitive layers, and then the metal nanowires 140 are disposed on the surfaces of the photo-sensitive layers after the drying process. In other words, after the drying process, the metal nanowires 140 is distributed to form the first metal nanowire layer 140A on the first photo-sensitive layer 120A and also the second metal nanowire layer 140B on the second photo-sensitive layer 120B. In one embodiment, the photo-sensitive layers and the metal nanowire layers can be processed by consequent steps to form the patterned electrodes, which can be applied to, for example but not limited to, detect the touch signals.

In the embodiment of this disclosure, the ink includes solvents, such as water, alcohol, ketone, ether, hydrocarbon or aromatic solvent (e.g. benzene, toluene, xylene, etc.). The ink may also include additives, interface active agent or binder, such as carboxymethyl cellulose (CMC), 2-hydroxyethyl cellulose (HEC), hydroxypropyl methylcellulose (HPMC), sulfonic acid ester, sulfate, disulfonate, sulfosuccinate, phosphate or fluorosurfactant, and the likes. The metal nanowire layer may be, for example, a silver nanowire layer, a gold nanowire layer or a copper nanowire layer. In more detailed, the term "metal nanowire" as used herein is a collective term that refers to a plurality of elemental metals, metal alloys or metal compounds (including metal oxides), wherein the number of metal nanowires contained therein does not affect the claimed protection range. In addition, at least one cross-sectional dimension of the single metal nanowire (i.e. the diameter of the cross-section) is less than 500 nm, preferably less than 100 nm, and more preferably less than 50 nm. The metal nanostructure of the "wires" in this disclosure mainly has a high aspect ratio, for example, between 10 and 100,000. Specifically, the aspect ratio (length:diameter of the cross-section) of the metal nanowire may be greater than 10, preferably greater than 50, and more preferably greater than 100. The metal nanowires may be made of any metal including, for example but not limited to, silver, gold, copper, nickel and gold-plated silver. Other terms, such as silk, fiber, tube, etc., which also have the above-mentioned dimensions and high aspect ratios, are also within the scope of the present disclosure.

The ink or solution containing metal nanowires 140 can be formed on the opposite surfaces of the substrate 110 by any method such as, for example but not limited to, screen printing, nozzle coating, roller coating, etc. In one embodiment, a roll to roll process can be used to apply the ink containing metal nanowires 140 to the opposite surfaces of a continuous supplied substrate 110. After the curing/drying step described above, the metal nanowires 140 can be distributed on the surfaces of the photo-sensitive layer in a random manner, and are fixed on the surfaces of the substrate 110 by the function of the photo-sensitive layer. For example, the photo-sensitive layer provides for adhesion to fix the metal nanowires 140 on the substrate 110.

In some embodiments of this disclosure, the metal nanowires 140 can be silver nanowires or silver nanofibers having an average diameter of above 20-100 nm and an average length of above 20-100 µm, and preferably an average diameter of above 20-70 nm and an average length of above 20-70 µm. That is, the aspect ratio thereof is about 1000. In some embodiments, the diameter of the metal nanowires 140 is between 70 nm and 80 nm, and the length thereof is about 8 µm.

After the step of forming the photo-sensitive layers and the metal nanowire layers, a lithography process is performed as shown in FIGS. 2 and 3. In this disclosure, the photo-sensitive layers can be processed with the following exposure and development processes (referred to the lithography process) depending on the photo-sensitive property of the photo-sensitive layers, thereby performing the patterning process of the photo-sensitive layers and the metal nanowire layers. This embodiment adopts the double-sided lithography process to pattern the first photo-sensitive layer 120A and the second photo-sensitive layer 120B, thereby forming the patterns of the double-sided electrodes on the dual surfaces on the substrate 110. In this embodiment, the double-sided lithography process may include steps of: performing a double-sided exposure process to define removing areas 130B and remaining areas 130A on the first photo-sensitive layer 120A and the second photo-sensitive layer 120B (see FIG. 2); and performing a double-sided developing process to remove materials of the photo-sensitive layers and the metal nanowire layers in the defined removing areas 130B, thereby patterning the metal nanowire layers to form, for example, a first electrode on the upper surface of the substrate 110 and a second electrode on the lower surface of the substrate 110.

The first photo-sensitive layer 120A and the second photo-sensitive layer 120B can be processed with the exposure process simultaneously or sequentially. In practice, the above-mentioned double-sided exposure step can adopt two light sources for performing the exposure process to the first photo-sensitive layer 120A and the second photo-sensitive layer 120B, respectively. The mask(s) can be provided between the light sources and the first photo-sensitive layer 120A and the second photo-sensitive layer 120B so as to transfer the patterns of the masks onto the first photo-sensitive layer 120A and the second photo-sensitive layer 120B, thereby defining the above-mentioned removing areas 130B and the remaining areas 130A. For example but not limited to, the following solution can be used to prevent the interference between the two light sources.

Two light sources (e.g. a first light source and a second light source) emitting lights/radiation in similar or substantially the same wavelength range are disposed above and below the substrate 110, respectively. For example, the two light sources can be both NUV (Near UV, wavelength range is 300-450 nm. In one embodiment, and the two light sources both emit G-line UV light (436 nm) or both I-line UV light (365 nm). The first photo-sensitive layer 120A and the second photo-sensitive layer 120B are made of the photoresist having similar or substantially the same photo sensitivity. For example, the photoresist is sensitive to G-line UV light sources or I-line UV light sources. In addition, a light absorption material (about 0.1%~10% by weight or volume) is added into the photoresist. For example, the UV absorber can be added into the first photo-sensitive layer 120A and the second photo-sensitive layer 120B with respect to the UV light sources. Accordingly, when the upper light source irradiates light to expose the first photo-sensitive layer 120A, the energy of the light emitted from the upper light source can be sufficiently absorbed by the first photo-sensitive layer 120A (e.g. greater than about 80%), and the energy of light emitted from the upper light source will not affect the second photo-sensitive layer 120B. Similarly, when the lower light source irradiates light to expose the second photo-sensitive layer 120B, the energy of the light emitted from the lower light source can be sufficiently absorbed by the second photo-sensitive layer 120B (e.g. greater than about 80%), and the energy of light emitted from the lower light source will not affect the first photo-sensitive layer 120A. Therefore, the first photo-sensitive layer 120A and the second photo-sensitive layer 120B can be processed by the exposure process at the same time, and the patterning results thereof are not interfered. For example, when two I-line UV light sources are selected to perform the above-mentioned double-sided exposure process, the major UV absorption additives of the first photo-sensitive layer 120A and the second photo-sensitive layer 120B comprise Octyl-3-[3-tert-butyl-4-hydroxy-5-(5-chloro-2H-benzotriazole-2-yl)phenyl]propionate and 2-Ethylhexyl-3-[3-tert-butyl-4-hydroxy-5-(5-chloro-2H-benzotriazole-2-yl)phenyl]propionate, and the chemical formula thereof is:

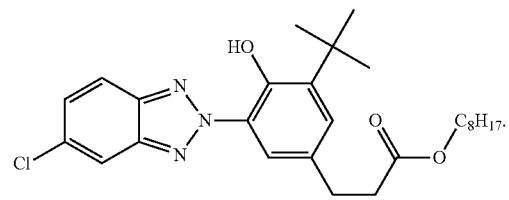

Figure 4:
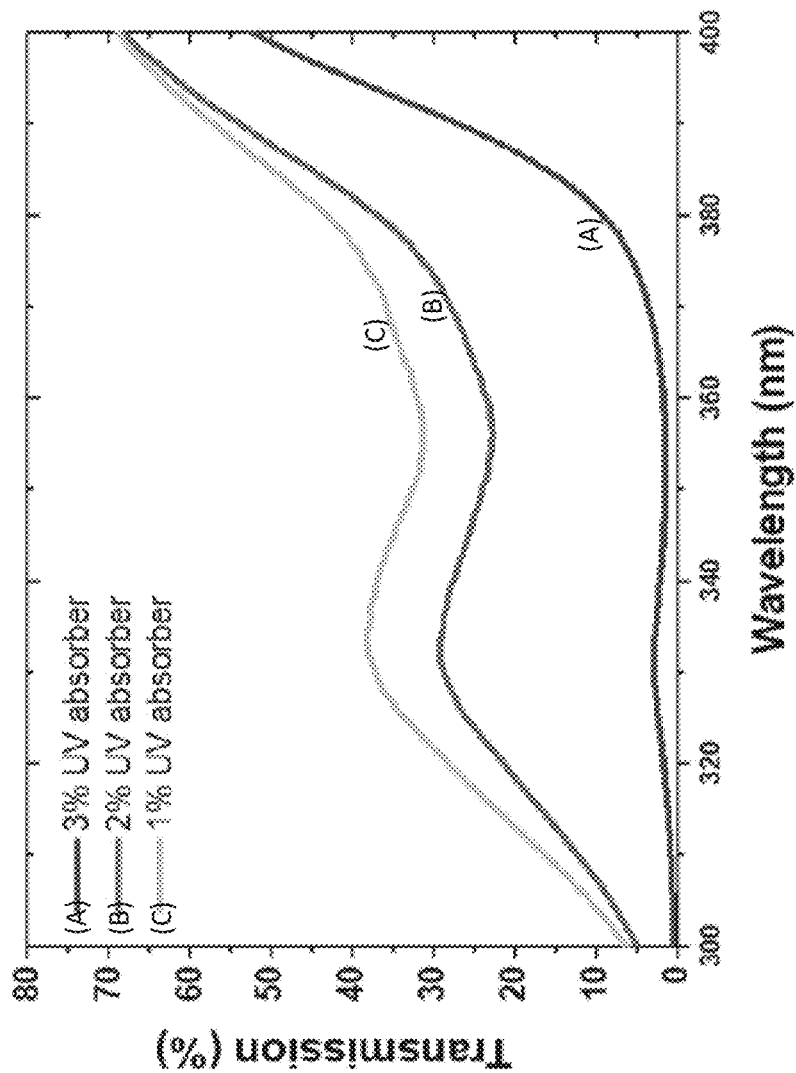
FIG. 4 is a schematic graph showing the relation between the concentration of the UV light (I-line) absorption additive and the UV light transmission rate.

Accordingly, the light transmittance (T %) of I-line UV light with respect to the photo-sensitive layers is lower than about 30%, preferably lower than about 20%, preferably lower than about 10%, and more preferably lower than about 5%. FIG. 4 shows the relation of the concentration of the UV light absorption additive and I-line UV light transmittance through the layer. In this embodiment, the concentration of the UV light absorption additive is about 1%~3%, preferably about 3% by weight, preferably about 2% by weight, and more preferably about 1% by weight.

In one modified embodiment, the light sources having the same wavelength are disposed above and below the substrate 110, respectively, and the selected photoresist for manufacturing the first photo-sensitive layer 120A and the second photo-sensitive layer 120B has a high absorption of UV light (e.g. greater than 80% of the total energy of the UV light), thereby preventing the interference between the exposures of the first photo-sensitive layer 120A and the second photo-sensitive layer 120B. In another modified embodiment, the parameters of the upper and lower light sources (e.g. the power, exposure energy, etc.) can be adjusted so as to prevent the interference between the exposures of the first photo-sensitive layer 120A and the second photo-sensitive layer 120B.

In one modified embodiment, the double-sided exposure step may provide the light sources having different wavelength ranges above and below the substrate 110, respectively. For example, one light source is a G-line UV light source, and the other light source is an I-line UV light source. The photoresists of the first photo-sensitive layer 120A and the second photo-sensitive layer 120B have the absorption properties corresponding to the wavelengths of the lights emitted from the two light sources, respectively. The photo-sensitive layer 120A and the second photo-sensitive layer 120B have different photo sensitivities. For example, one photoresist is sensitive to the light emitted from G-line UV light source, and the other photoresist is sensitive to the light emitted from I-line UV light source. Accordingly, the chemical reactions of the first photo-sensitive layer 120A and the second photo-sensitive layer 120B can be induced by the light sources having different wavelengths, thereby preventing the interference between the exposures of the first photo-sensitive layer 120A and the second photo-sensitive layer 120B. In addition, this embodiment can also utilize the above-mentioned light absorption additives, and the detailed descriptions thereof will be omitted.

After the above-mentioned double-sided exposure step, a double-sided developing step, which is also called as strip step, is performed. In the double-sided developing step, the developing solution is provided to remove the exposed first positive-type photo-sensitive layer 120A and the exposed second positive-type photo-sensitive layer 120B from the surface of the substrate 110, and meanwhile, materials of the metal nanowire layers 140A and 140B on the removed photo-sensitive layers 120A/120B in the removing areas 130B are also removed from the substrate 110. In other words, this embodiment can perform an integrated developing step to remove not only materials of the first photo-sensitive layer 120A and the first metal nanowire layer 140A within the removing areas 130B on the upper surface of the substrate 110 but also materials of the second photo-sensitive layer 120B and the second metal nanowire layer 140B within the removing areas 130B on the lower surface of the substrate 110 simultaneously by utilizing the developing solution. Accordingly, the metal nanowire layers can be patterned to manufacture electrodes on double sides of the substrate 110. That means the traditional method of usage of etching solution/etchants is omitted and the patterning process of both the photo-sensitive layers and metal nanowire layers is performed simultaneously so as to obtain the desired double-sided structure of the patterned metal nanowire layers. In one embodiment, the double-sided developing step mainly utilizes the developing solution (or photoresist stripping solution) to remove the photo-sensitive layer and the metal nanowire layer in the removing areas 130B, thereby forming the patterned electrode structure, which can be used as, for example but not limited to, the sensing electrodes of the touch panel. More specifically, the developing solution can remove the photo-sensitive layer in the removing areas 130B, and the metal nanowire layer within the removing areas 130B can be removed in the same developing process too (e.g., a lift-off process), thereby manufacturing the patterned electrodes on the upper and lower surfaces of the substrate 110. In other embodiments, the step of removing the photo-sensitive layer and metal nanowire layer within the removing areas 130B can be performed with the developing solution and another solvent. In other embodiments, it is also possible to use a developing solution in combination with a mechanical means, such as spraying the solution onto a target with a pressure spray head, immersing with an ultrasonic oscillating, etc., for removing the photo-sensitive layer and the metal nanowire layer within the removing areas 130B. The developing step of this disclosure is a technique well known in the art. Briefly, the parts of the photo-sensitive material in the photo-sensitive layer irradiated by the light can generate a chemical reaction, so that the chemical bonds become firm, and the masked parts of the photo-sensitive material in the photo-sensitive layer, which do not irradiated by the light can be removed by the above-mentioned developing solution. This is based on a negative photo-sensitive layer for example.

In one embodiment, the first photo-sensitive layer 120A and the second photo-sensitive layer 120B are made of negative-type photo-sensitive photoresist. Accordingly, the removing areas 130B are defined by the non-exposure region, and the remaining areas 130A are defined by the exposure region. Proper developing solutions can be provided to remove the parts of the first photo-sensitive layer 120A and the second photo-sensitive layer 120B within the removing areas 130B. In practice, the developing solution comprises tetramethylammonium hydroxide (TMAH), xylene ($C_6H_4(CH_3)_2$), butyl acetate or aromatic hydrocarbon solvent for removing the parts of the first photo-sensitive layer 120A and the second photo-sensitive layer 120B within the removing areas 130B. In the process for removing photo-sensitive layers 120A/120B, the parts of the metal nanowire layer 140 on the removed photo-sensitive layers 120A/120B are also lifted-off. In one embodiment, the first photo-sensitive layer 120A and the second photo-sensitive layer 120B are made of positive-type photo-sensitive photoresist, so that the removing areas 130B are defined by the exposure region, and the remaining areas 130A are defined by the non-exposure region. Proper developing solutions can be provided to remove the parts of the first photo-sensitive layer 120A and the second photo-sensitive layer 120B within the removing areas 130B. In practice, the developing solution comprises alkaline solution (e.g. KOH, $Na_2CO_3$) for removing the parts of the first photo-sensitive layer 120A and the second photo-sensitive layer 120B within the removing areas 130B. The parts of the metal nanowire layer 140 are simultaneously lifted-off in the process for removing photo-sensitive layers 120A/120B. After the above-mentioned lift-off process, the remained parts of the first metal nanowire layer 140A and the first photo-sensitive layer 120A have corresponding patterns. In one embodiment, the remained parts of the first metal nanowire layer 140A and the first photo-sensitive layer 120A have substantially the same patterns. In other words, the edges of the remained parts of the first metal nanowire layer 140A are aligned with the edges of the remained parts of the first photo-sensitive layer 120A. Similarly, the remained parts of the second metal nanowire layer 140B and the second photo-sensitive layer 120B have substantially the same patterns. In other words, the edges of the remained parts of the second metal nanowire layer 140B are aligned with the edges of the remained parts of the second photo-sensitive layer 120B.

In an embodiment, the first photo-sensitive layer 120A and the second photo-sensitive layer 120B have the same type of photo sensitivity, and the above-mentioned developing process or the lift-off process can be performed simultaneously for forming double-sided electrodes.

In one embodiment, the first photo-sensitive layer 120A and the second photo-sensitive layer 120B can be made of photoresists with different photo sensitivities (e.g. a negative-type photoresist and a positive-type photoresist). Accordingly, the developing processes to the double sides of substrate 110 are performed in sequence, and the exposure processes to the double sides of substrate 110 are performed in sequence.

So far, the double-sided electrode structure can be manufactured. In this embodiment, the first photo-sensitive layer 120A and the second photo-sensitive layer 120B are exposed to define the removing areas 130B and the remaining areas 130A. The parts of the first photo-sensitive layer 120A and the first metal nanowire layer 140A within the removing areas 130B are removed to define the first electrode on the upper surface of the substrate 110, and the parts of the second photo-sensitive layer 120B and the second metal nanowire layer 140B within the removing areas 130B are removed to define the second electrode on the lower surface of the substrate 110.

The touch panel with double-sided electrodes manufactured by the above method will be described hereinafter.

Figure 5:
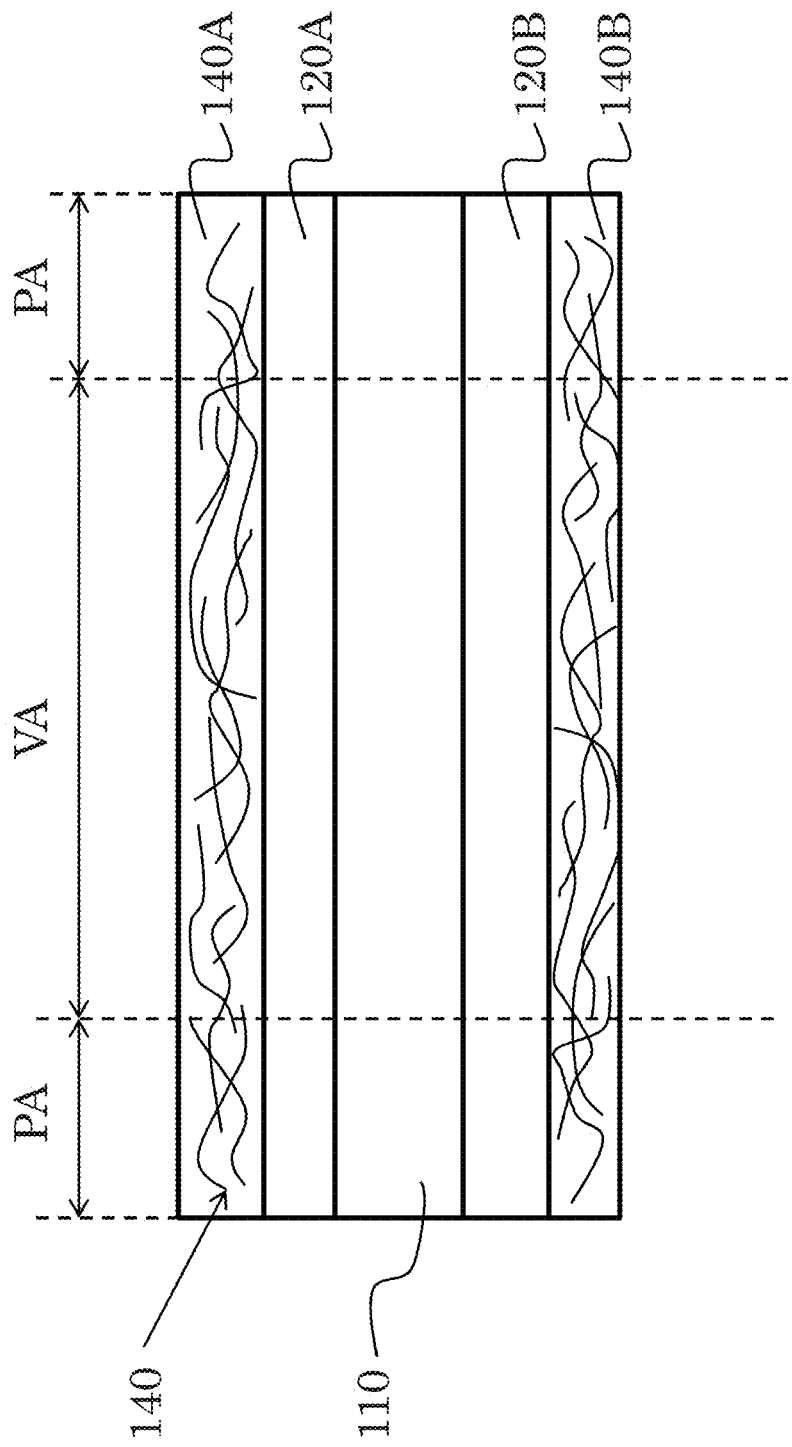
FIG. 5 is a schematic diagram showing the first step of the manufacturing method of the double-sided touch sensing electrode structure according to some embodiments of this disclosure.

Firstly, as shown in FIG. 5, a substrate 110 is provided. The substrate 110 can be defined with a display region VA and a peripheral region PA, and the peripheral region PA is disposed at one side of the display region VA. For example, the peripheral region PA can be disposed at the left side or the right side of the display region VA. In other embodiments, the peripheral region PA can be disposed in four sides of the display region VA (including the top side, the bottom side, the left side and the right side), or the peripheral region PA is an L-shape region located in two adjacent sides of the display region VA. This disclosure is not limited thereto.

Next, as mentioned above, the photo-sensitive layers and the metal nanowire layers are formed on the upper surface and the lower surface of the substrate 110. In one embodiment, the photo-sensitive layers and the metal nanowire layers are disposed on the display region VA and the peripheral region PA. In one embodiment, a part of the photo-sensitive layers will be remained in the display region VA, so that the material of the photo-sensitive layers is required to have suitable optical properties, for example, the above-mentioned light absorption property and high visible light transmittance. Specifically, the photo-sensitive layers on the upper surface and lower surface of the substrate 110 are made of the same polymer, and the polymer can react with UV light in an exposure process. Preferably, the material of the photo-sensitive layers can absorb desired amount of energy of a specific wavelength (e.g. at least 10%, at least 20%, at least 25% or about 20-50% of the total energy of UV light), and it can substantially allow the visible light (e.g. about 400-700 nm) to pass through. For example, greater than 85% of the total energy of the visible light can pass through the photo-sensitive layers. Alternatively, the material having the visible light transmittance greater than about 85% is selected to form the photo-sensitive layers.

Figure 6:
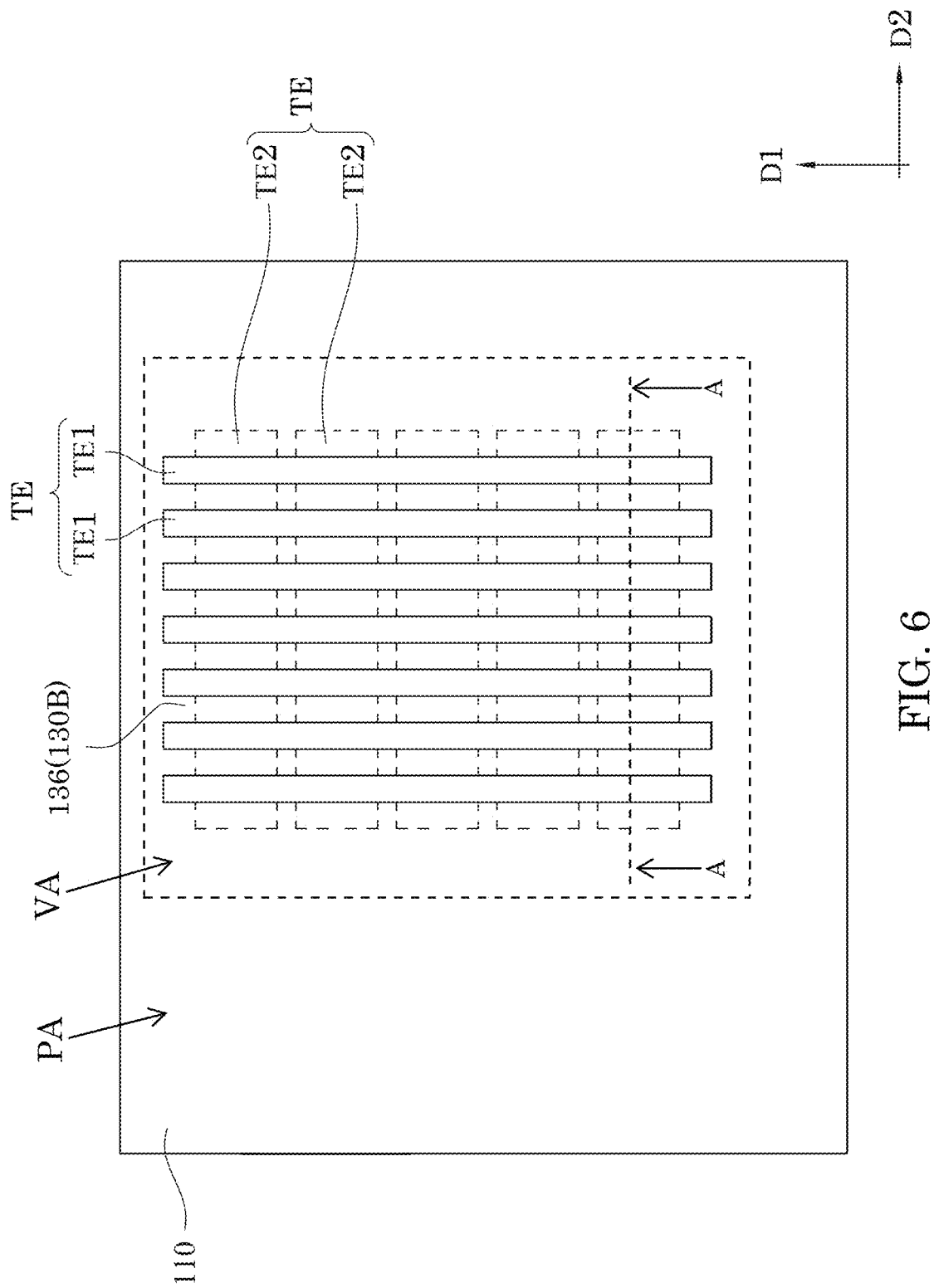
FIG. 6 is a schematic diagram showing the second step of the manufacturing method of the double-sided touch sensing electrode structure according to some embodiments of this disclosure.
Figure 6A:
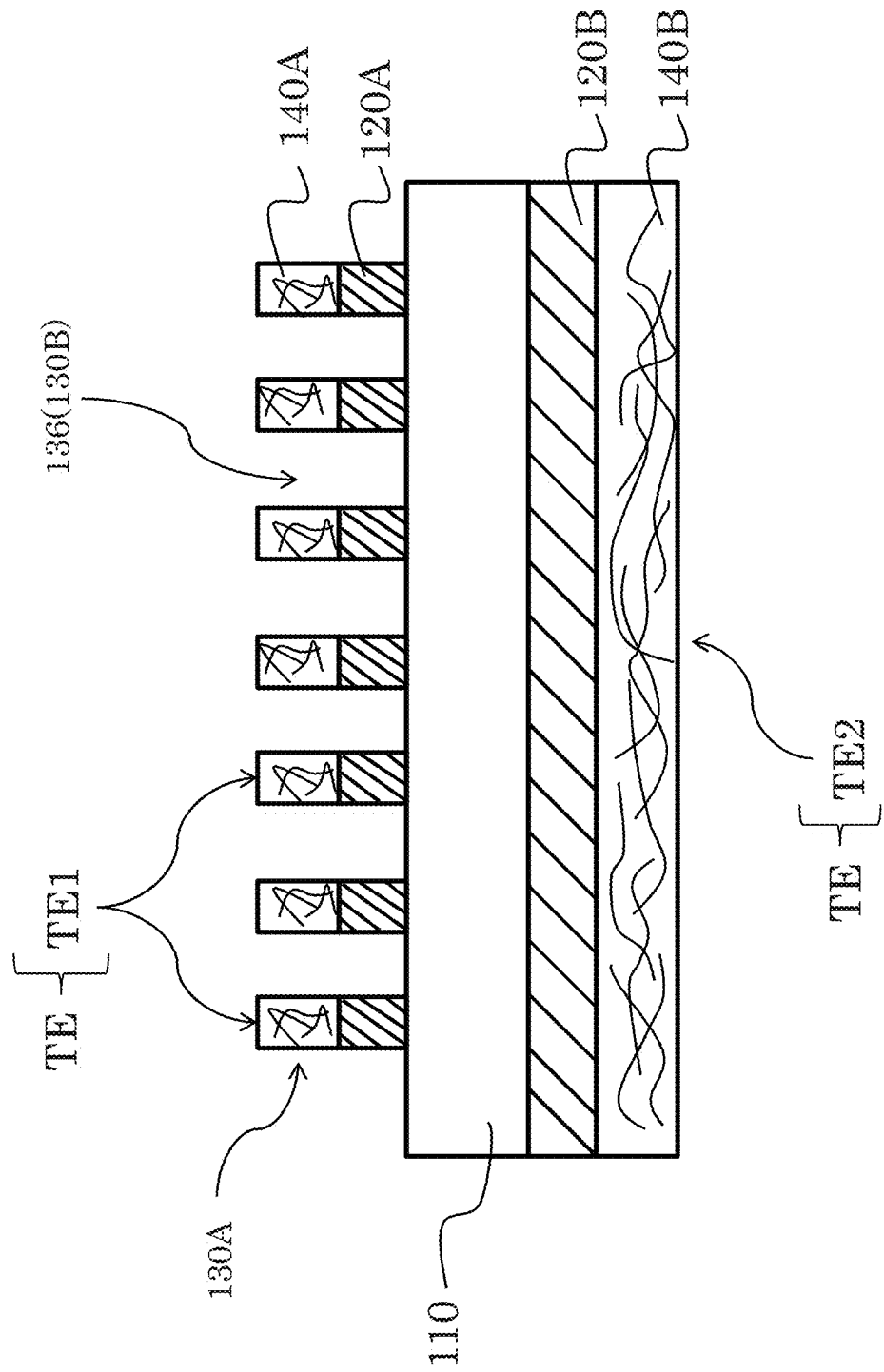
FIG. 6A is a sectional view of FIG. 6 along the line A-A.

Afterwards, a double-sided lithography process is performed to pattern the first metal nanowire layer 140A and the second metal nanowire layer 140B. FIG. 6 shows the double-sided touch sensing module TE after the double-sided lithography process. Referring to FIG. 6A, which is a sectional view of FIG. 6, when viewing from the upper surface of the substrate 110, the part of the first metal nanowire layer 140A in the removing areas 130B is removed, and the remained part of the first metal nanowire layer 140A (i.e., the part of the first metal nanowire layer 140A in the remaining areas 130A) can construct as one or more first touch sensing electrode TE1. In one embodiment, the first touch sensing electrode TE1 is substantially disposed in the display region VA and includes a plurality of linear sensing electrodes extending along one direction (e.g., the first direction D1). The removing areas 130B can be defined as non-conductive regions 136 for electrically isolating the adjacent sensing electrodes of the first touch sensing electrode TE1. The remained first photo-sensitive layer 120A is disposed between the sensing electrodes and the substrate 110. After the above-mentioned lift-off process, the first touch sensing electrode TE1 (i.e., the remained first metal nanowire layer 140A) and the remained first photo-sensitive layer 120A can have corresponding patterns. In one embodiment, the first touch sensing electrode TE1 (i.e., the remained first metal nanowire layer 140A) and the remained first photo-sensitive layer 120A substantially have substantially matched patterns. For example, both the remained first metal nanowire layer 140A and the remained first photo-sensitive layer 120A are linear or straight structures/patterns/configurations. In addition, the edge of the first touch sensing electrode TE1 (i.e., the remained first metal nanowire layer 140A) is aligned with the corresponding edge of the remained first photo-sensitive layer 120A.

Similarly, when viewing from the lower surface of the substrate 110, the part of the second metal nanowire layer 140B in the removing areas 130B is removed, and the remained part of the second metal nanowire layer 140B (i.e., the part of the second metal nanowire layer 140B in the remaining areas 130A) can construct as a second touch sensing electrode TE2. In one embodiment, the second touch sensing electrode TE2 is substantially disposed in the display region VA and includes a plurality of linear sensing electrodes extending along one direction (e.g., the second direction D2). The removing areas 130B can be defined as a non-conductive region 136 for electrically isolating the adjacent sensing electrodes of the second touch sensing electrode TE2. The remained second photo-sensitive layer 120B is disposed between the sensing electrodes and the substrate 110. After the above-mentioned lift-off process, the second touch sensing electrode TE2 (i.e., the remained second metal nanowire layer 140B) and the remained second photo-sensitive layer 120B can have corresponding patterns. In one embodiment, the second touch sensing electrode TE2 (i.e., the second metal nanowire layer 140B) and the remained second photo-sensitive layer 120B substantially have substantially matched patterns. For example, both the remained second metal nanowire layer 140B and the remained second photo-sensitive layer 120B are linear or straight structures/patterns/configurations. In addition, the edge of the second touch sensing electrode TE2 (i.e., the remained second metal nanowire layer 140B is aligned with the corresponding edge of the remained second photo-sensitive layer 120B.

As shown in FIG. 6, the first touch sensing electrode TE1 and the second touch sensing electrode TE2 are interlaced with each other, and the two touch sensing electrodes TE1, TE2 are constructs as a touch sensing module TE for sensing the touches or control gestures.

The above steps can refer to the previous embodiments, so the detailed descriptions thereof will be omitted.

Figure 7:
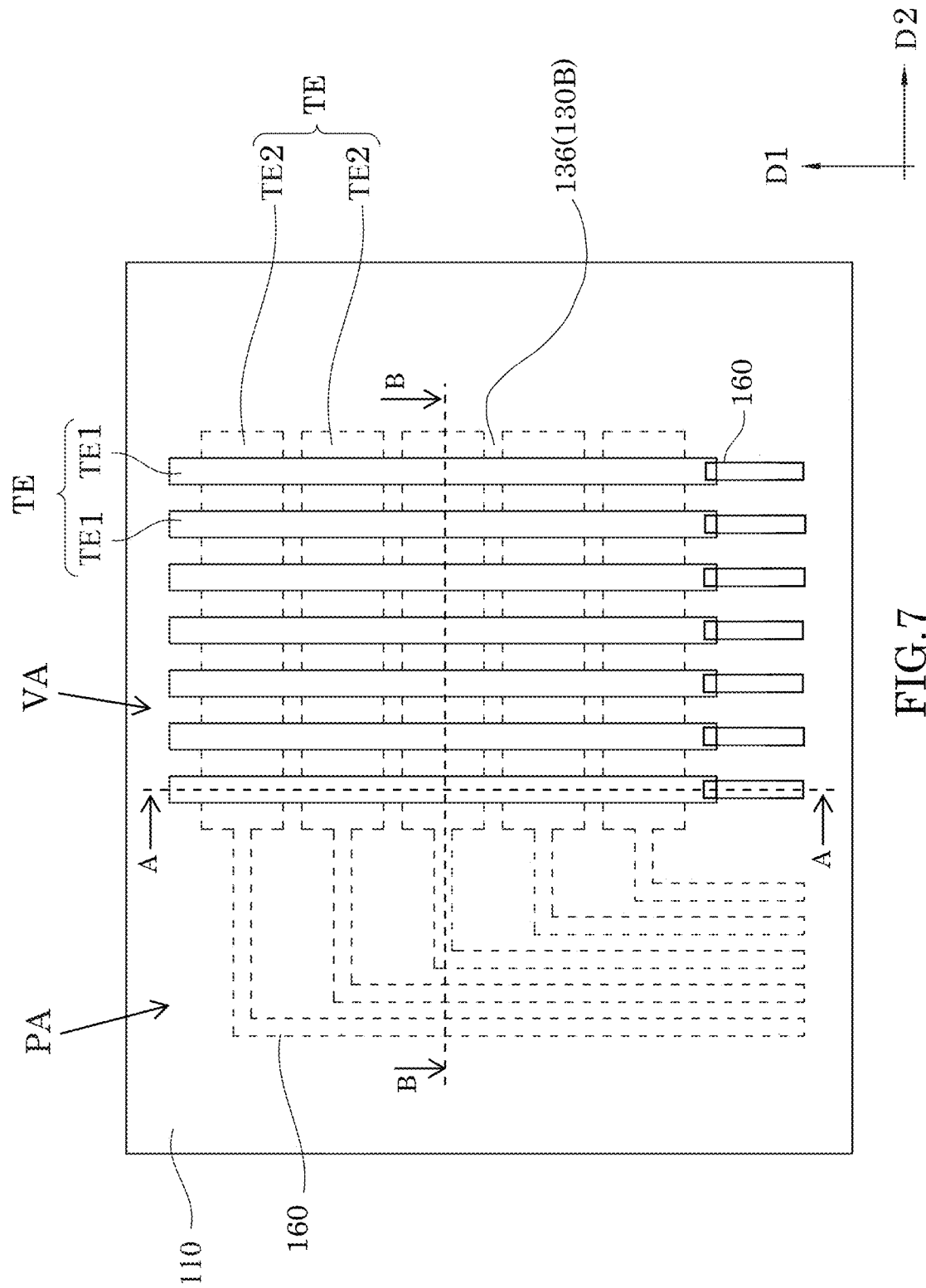
FIG. 7 is a schematic diagram showing the third step of the manufacturing method of the double-sided touch sensing electrode structure according to some embodiments of this disclosure.
Figure 7A:
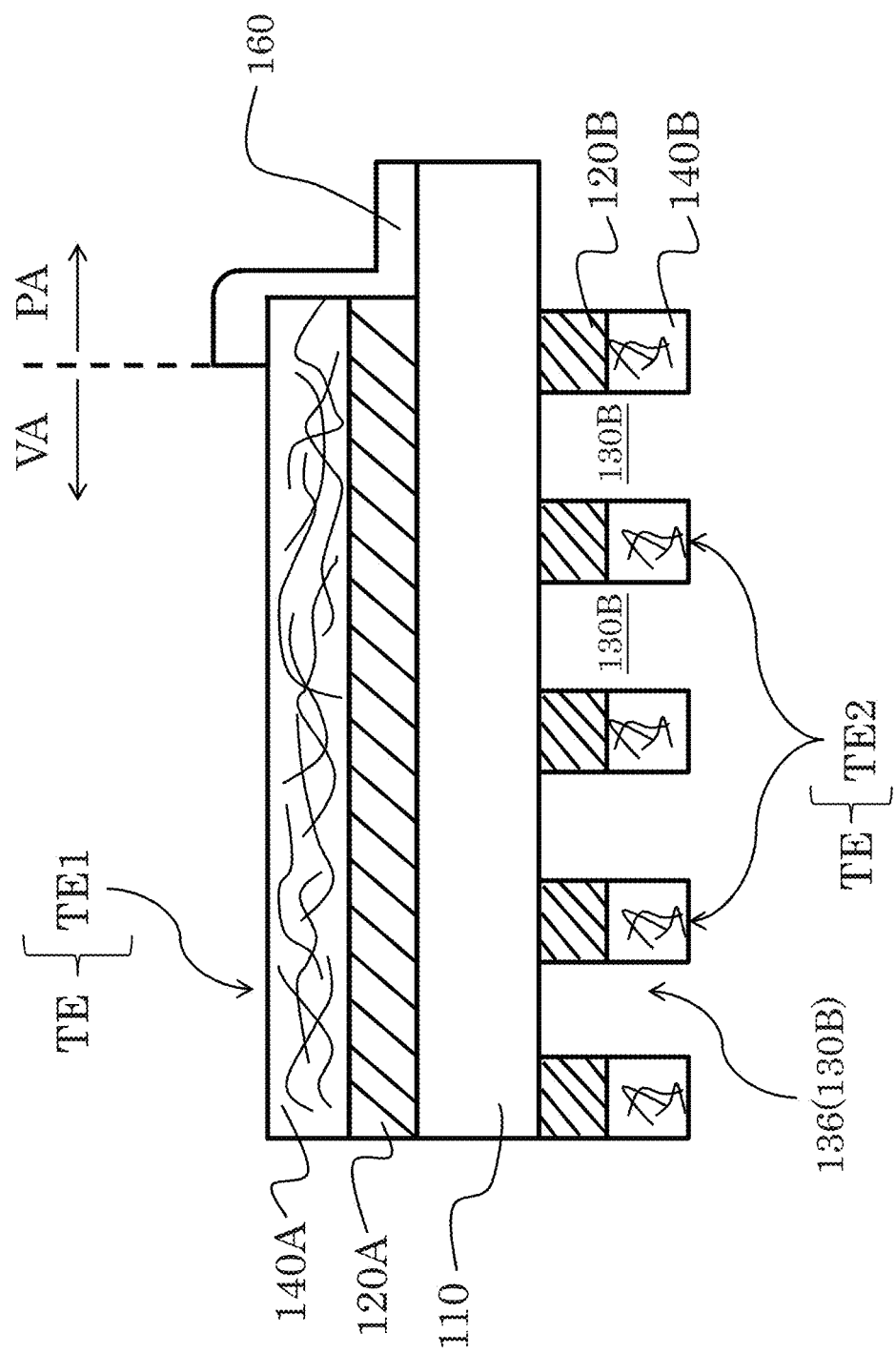
FIG. 7A is a sectional view of FIG. 7 along the line A-A.
Figure 7B:
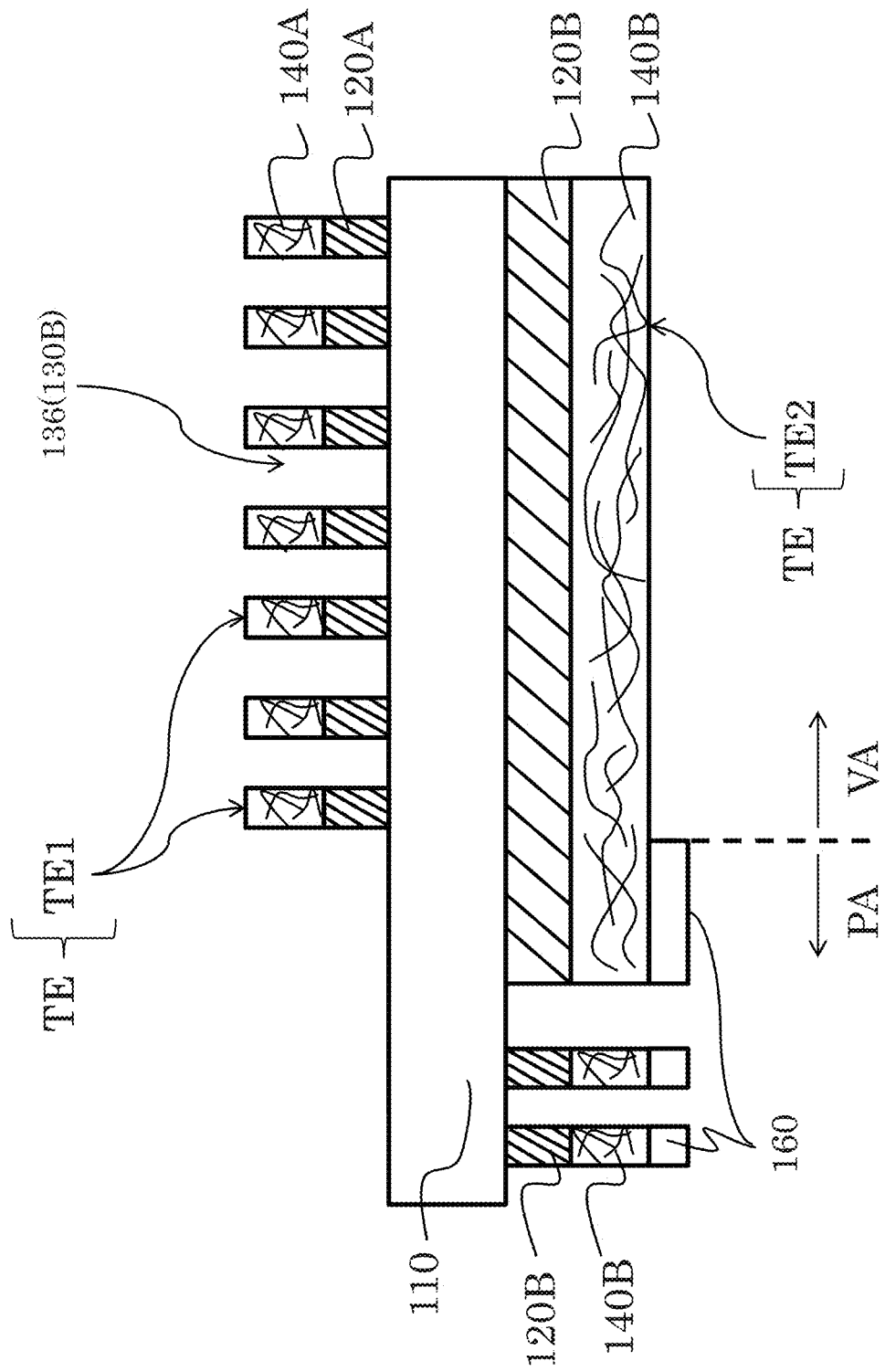
FIG. 7B is a sectional view of FIG. 7 along the line B-B.
Figure 8:
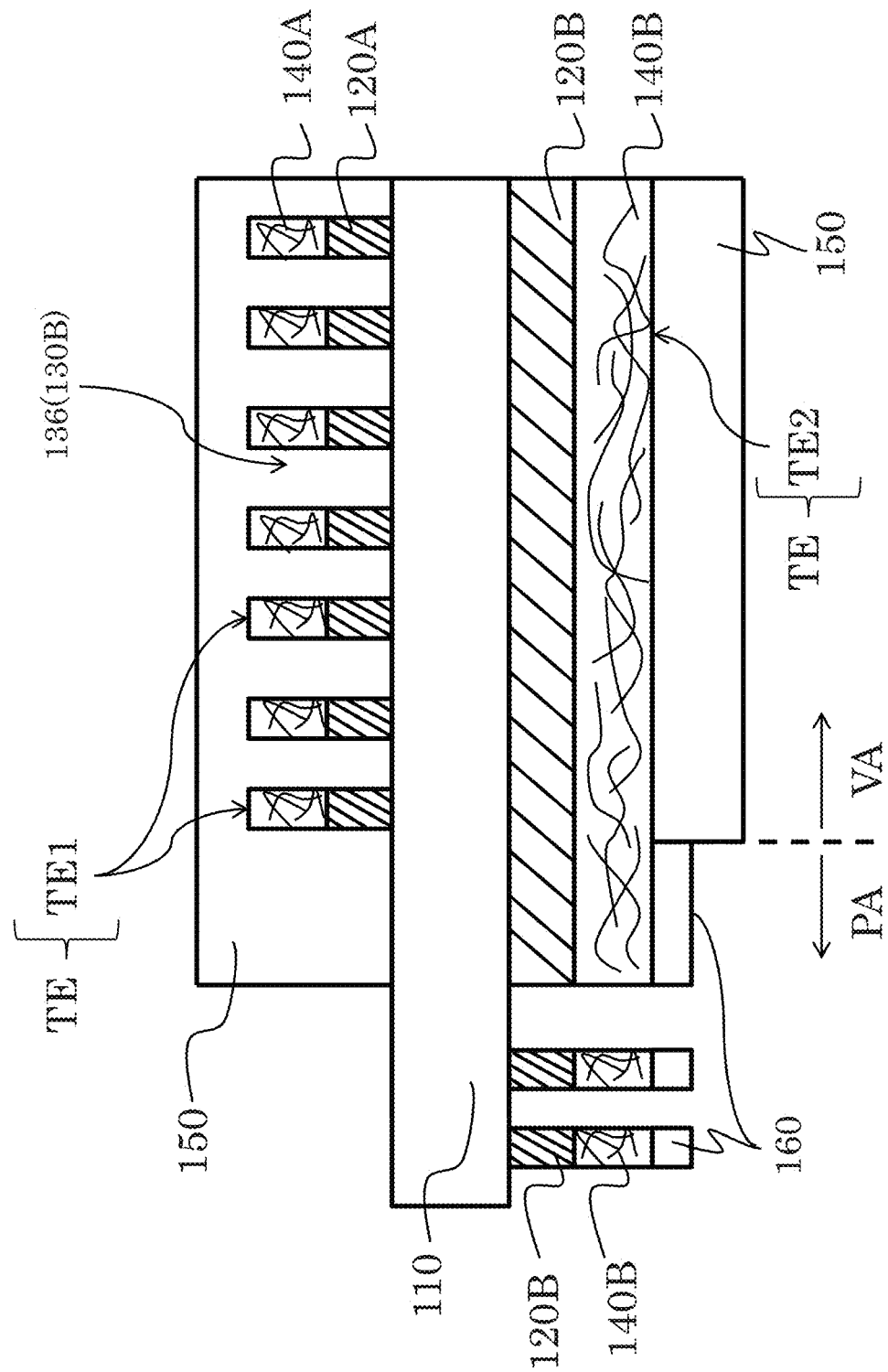
FIG. 8 is a schematic diagram showing the fourth step of the manufacturing method of the double-sided touch sensing electrode structure according to some embodiments of this disclosure.

Next, in one embodiment with reference to FIGS. 7, 7A and 7B, the peripheral circuit 160 can be formed on the peripheral region PA. One or more peripheral circuit 160 is electrically connected with the touch sensing module TE for transmitting signals, such as control signals and touch sensing signals between the touch sensing module TE and the external controller (not shown). Specifically, the peripheral circuits 160 are formed on the upper and lower surfaces of the substrate 110, and the peripheral circuits 160 are substantially disposed in the peripheral region PA. In addition, at least a portion of one peripheral circuit 160 physically contacts with the corresponding first touch sensing electrode TE1 and at least a portion of one peripheral circuit 160 physically contacts with the corresponding second touch sensing electrode TE2. For example, an end portion of the peripheral circuit 160 climbs upon the corresponding first touch sensing electrode TE1. In this embodiment, an electrical conductive metal (e.g., a single-layer silver, a single-layer copper, or a multi-layer material (Mo/Al/Mo)) is formed on the substrate 110, and then a lithography process and an etching process are performed to manufacture the peripheral circuit(s) 160.

In one embodiment, the touch sensing module TE can extend to the peripheral region PA. As shown in FIG. 7B, at least one of the second touch sensing electrodes TE2 includes an extension portion extending to and formed on the peripheral region PA. Accordingly, the corresponding peripheral circuit 160 can be formed on extension portion of the second touch sensing electrodes TE of the touch sensing module TE so as to form a sandwiched composite structure including a metal layer (i.e., the peripheral circuit 160), the metal nanowire layer, and the photo-sensitive layer. After the lift-off process, the edge of the portion of the metal nanowire layer in the peripheral region PA is aligned with the edge of the portion of the photo-sensitive layer in the peripheral region PA. Preferably, the edge of the metal layer (the peripheral circuit 160) is also aligned with the corresponding edges of the metal nanowire layer and the photo-sensitive layer. Accordingly, the wire width (the width of the above-mentioned sandwiched composite structure) in the peripheral region PA can be controlled within a certain range, thereby further reducing the width of the peripheral region PA for achieving the narrow border/thin border/ultra-thin border effect.

In one embodiment, a protection layer 150 is formed to cover the first touch sensing electrode TE1 and the second touch sensing electrode TE2 prior to the step of forming the peripheral circuit 160. In one embodiment, the portions of the first touch sensing electrode TE1 and the second touch sensing electrode TE2 are exposed form the protection layer 150 for the connection with the peripheral circuit 160. Next, at least one peripheral circuit 160 is formed on the upper and lower surfaces of the substrate 110 as discussed above. The peripheral circuit 160 is substantially disposed in the peripheral region PA, and at least a portion of one peripheral circuit 160 physically contacts with the corresponding first touch sensing electrode TE1 and at least a portion of one peripheral circuit 160 physically contacts with the corresponding second touch sensing electrode TE2. In this embodiment, the protection layer 150 is made of a photoresist material, and the protection layer 150 is processed to form holes to expose portions of the first touch sensing electrode TE1 and the second touch sensing electrode TE2. Then an electrical conductive metal (e.g. a single-layer silver, a single-layer copper, or a multi-layer material (Mo/Al/Mo)) is formed on the protection layer 150 and contacts with the exposed first and/or second touch sensing electrodes TE1 and TE2. Afterwards, a lithography process and an etching process are performed on the electrical conductive metal to manufacture one or more peripheral circuits 160.

In one embodiment, a layer of silver pastes is disposed on the peripheral region PA by screen printing, and then a laser etching process is performed on the silver-paste layer to form the peripheral circuit 160. Afterwards, the photoresist coating process, exposure process and developing process are performed on both sides of the substrate to form the protection layer 150 on the touch sensing module TE in the display region VA. The order of the above-mentioned steps can be changed. That is, the protection layer 150 can be formed before the step of forming the peripheral circuit 160.

To be noted, due to the sandwiched composite structure in the peripheral region PA, the peripheral circuit 160 may directly contact with the metal nanowires 140 of the first touch sensing electrode TE1 or the metal nanowires of the second touch sensing electrode TE2 for forming the desired conductive circuits. Accordingly, the metal nanowires 140 of the touch sensing module TE and the peripheral circuit 160 can performs as a signal transmission path with low impedance for transmitting the control signals and touch sensing signals between the touch sensing electrode TE and the external controller. Because of low-impedance circuits, the loss of signal transmission can be sufficiently reduced, thereby solving the high impedance issue of the conventional structure.

The touch sensing module TE in the display region VA is covered by the protection layer 150, so that the metal nanowires 140 can be protected from oxidation, moisture, acid, alkaline, or organic solvents.

After the above-mentioned steps, the touch panel, which has the touch sensing function and can be assembled with the display device, can be manufactured. The manufactured touch panel comprises the touch sensing module TE formed on the upper and lower surfaces of the substrate 110 (i.e., the first touch sensing electrode TE1 and/or the second touch sensing electrode TE2 formed by the metal nanowires 140) and the peripheral circuit(s) 160 formed on the peripheral region PA of the substrate 110. The touch sensing module TE and the peripheral circuit(s) 160 are electrically connected with each other for transmitting signals.

Preferably, a post-treatment of the metal nanowires 140 can be performed to increase the conductivity thereof. The post-treatment may comprise the process of heating, plasma, corona discharge, UV ozone or pressure. For example, after the step of drying or curing the metal nanowire layer 140A, a roller is provided to press the metal nanowire layer 140A. In one embodiment, one or more rollers are provided to press the metal nanowire layer 140A with a pressure of about 50-3400 psi, preferably, about 100-1000 psi, preferably about 200-800 psi, and more preferably about 300-500 psi. In some embodiments, the heating and pressing processes can be performed simultaneously. In more detailed, one or more rollers are provided to press the metal nanowire layer 140A, and the one or more rollers are also heated. For example, the applied pressure of the rollers can be of about 10-500 psi, and preferably about 40-100 psi, and the one or more rollers are heated to about 70-200° C., and preferably about 100-175° C. These processes can increase the conductivity of the metal nanowire layer 140A. In some embodiments, the metal nanowires 140 are preferably exposed in the reduction agent for post-treatment. For example, the metal nanowires 140 composed of silver nanowires may preferably be exposed in a silver reduction agent for post-treatment. The silver reduction agent can be, for example, borohydride (e.g. sodium borohydride), boron nitrogen compound (e.g. dimethylaminoborane (DMAB)), or a gas reduction agent (e.g. hydrogen ($H_2$)). The exposure time is from about 10 seconds to about 30 minutes, and preferably from about 1 minute to about 10 minutes. The above step of applying pressure may be performed before or after the step of coating the layer 130.

In some embodiments of this disclosure, the etching solution for etching the metal nanowire layer is not used, and the patterning process, such as the lithography processes for the photo-sensitive layer can be performed to also pattern the metal nanowire layer. This configuration can omit the conventional etching step of utilizing the etching solution to etch the metal nanowire layer, thereby solving the residual etching solution issue and increasing the production yield.

In some embodiments of this disclosure, the conductive layer pattern structures (i.e., the first and second touch sensing electrodes) on the double surfaces of the substrate can be formed in a single lithography process, thereby simplifying the layout process of the touch sensing electrodes of the touch panel. Thus, this disclosure can make the process simpler and faster and have a lower manufacturing cost.

In some embodiments of this disclosure, the etching solution for etching the metal nanowire layer is not used, so that the issue caused by the residual etching solution for example, the peripheral circuit made of metal material is attacked by the residual etching solution can be prevented.

In some embodiments of this disclosure, the conventional etching step of the metal nanowire layer is not needed, so that the total manufacturing process can be simplified so as to reduce the manufacturing cost.

In some embodiments of this disclosure, the lift-off process can remove a part of the patterned metal nanowire layer as well as the corresponding photo-sensitive resist, thereby reducing the influence of the optical performance of the display device caused by the photoresist.

In some embodiments of this disclosure, the metal nanowires are directly coated on the photoresist layer, so that most of the metal nanowires can be exposed on the surface of the photoresist layer after the patterning process. This configuration is benefit to the following metal coupling step and decrease the contact impedance thereof, thereby forming a low impedance conductive circuit for increasing the transmission ability of the touch signals and decreasing the loss and distortion of the transmitted touch signals.

In some embodiments of this disclosure, the above-mentioned processes can be integrated in the roll-to-roll manufacturing technology, which can be used in the continuous type and batch type manufacturing of the touch panel with the double-sided electrode structure.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A patterning method for forming a double-sided electrode structure, comprising:
providing a substrate, wherein the substrate has two opposite surfaces, and a first photo-sensitive layer and a second photo-sensitive layer are respectively formed on the opposite surfaces;
forming a first metal nanowire layer on the first photo-sensitive layer and a second metal nanowire layer on the second photo-sensitive layer, wherein the first metal nanowire layer and the second metal nanowire layer are made of a plurality of metal nanowires; and
performing a double-sided lithography process, comprising:
performing an exposure process to define a removing area and a remaining area on the first photo-sensitive layer and a removing area and a remaining area on the second photo-sensitive layer; and
removing the first and second photo-sensitive layers and the metal nanowires of the first and second metal nanowire layers in the defined removing areas by a developer solution, thereby patterning the first and second metal nanowire layers to form a first electrode and a second electrode on the opposite surfaces, respectively.

2. The patterning method according to claim 1, wherein the first and second photo-sensitive layers are made of photoresist with substantially the same photo sensitivity.

3. The patterning method according to claim 2, wherein the performing the exposure process comprises:
providing a first light source corresponding to the first photo-sensitive layer and a second light source corresponding to the second photo-sensitive layer, wherein a first light emitted from the first light source and a second light emitted from the second light source are substantially in the same wavelength range;
wherein the first photo-sensitive layer absorbs more than about 80% of a total energy of the first light emitted from the first light source, and the second photo-sensitive layer absorbs more than about 80% of a total energy of the second light emitted from the second light source.

4. The patterning method according to claim 2, wherein the performing the exposure process comprises:
providing a first light source corresponding to the first photo-sensitive layer and a second light source corresponding to the second photo-sensitive layer, wherein a first light emitted from the first light source and a second light emitted from the second light source are substantially in the same wavelength range;
wherein the first and second photo-sensitive layers comprise about 0.1%-10% of a light absorption additive by weight.

5. The patterning method according to claim 4, wherein a concentration of the light absorption additive is about 1%-3% by weight, a light transmittance of the first photo-sensitive layer with respect to the first light emitted from the first light source is less than about 30%, and a light transmittance of the second photo-sensitive layer with respect to the second light emitted from the second light source is less than about 30%.

6. The patterning method according to claim 1, wherein the first and second photo-sensitive layers are made of photoresists with different photo sensitivities.

7. The patterning method according to claim 6, wherein the performing the exposure process comprises:
providing a first light source corresponding to the first photo-sensitive layer and a second light source corresponding to the second photo-sensitive layer, wherein a first light emitted from the first light source and a second light emitted from the second light source are in different wavelength ranges.

8. The patterning method according to claim 1, further comprising:
forming a protective layer; and
forming a peripheral circuit, wherein the peripheral circuit is electrically connected with the first electrode and the second electrode.

9. A double-sided electrode structure, comprising:
a substrate having opposite first and second surfaces; and
a first photo-sensitive layer and a first metal nanowire layer stacked on the first surface, and a second photo-sensitive layer and a second metal nanowire layer stacked on the second surface;
wherein a removing area and a remaining area are defined on the first photo-sensitive layer and a removing area and a remaining area are defined on the second photo-sensitive layer by an exposure process, the first photo-sensitive layer and the first metal nanowire layer in the removing area on the first photo-sensitive layer are removed to define a first electrode on the first surface, and the second photo-sensitive layer and the second metal nanowire layer in the removing area on the second photo-sensitive layer are removed to define a second electrode on the second surface.

10. The double-sided electrode structure according to claim 9, wherein the first and second photo-sensitive layers are made of photoresists with the same photo sensitivity, the first photo-sensitive layer absorbs more than about 80% of a total energy of a first light emitted from a first light source, and the second photo-sensitive layer absorbs more than about 80% of a total energy of a second light emitted from a second light source.

11. The double-sided electrode structure according to claim 9, wherein the first and second photo-sensitive layers are made of photoresists with the same photo sensitivity, and the first and second photo-sensitive layers comprise about 0.1%-10% of a light absorption additive by weight.

12. The double-sided electrode structure according to claim 11, wherein a concentration of the light absorption additive is about 1%-3% by weight, a light transmittance of the first photo-sensitive layer with respect to a first light emitted from a first light source is less than about 30%, and a light transmittance of the second photo-sensitive layer with respect to a second light emitted from a second light source is less than about 30%.

13. The double-sided electrode structure according to claim 9, wherein the first and second photo-sensitive layers are made of photoresists with different photo sensitivities.

14. The double-sided electrode structure according to claim 9, wherein the first photo-sensitive layer and the first metal nanowire layer in the remaining area have the same pattern, and the second photo-sensitive layer and the second metal nanowire layer in the remaining area have the same pattern.

15. The double-sided electrode structure according to claim 9, wherein the first electrode comprises a plurality of sensing electrodes extending along a first direction, the second electrode comprises a plurality of sensing electrodes extending along a second direction, and the sensing electrodes of the first and second electrodes are located in a display area.

16. The double-sided electrode structure according to claim 15, further comprising a peripheral circuit disposed in a peripheral area, wherein the peripheral circuit is electrically connected with the sensing electrodes of the first and second electrodes.

17. The double-sided electrode structure according to claim 9, further comprising a protective layer covering the first electrode and the second electrode.

* * * * *